United States Patent
Wilcox et al.

(10) Patent No.: US 9,817,069 B1
(45) Date of Patent: Nov. 14, 2017

(54) METHOD AND SYSTEM FOR CONSTRUCTION OF A HIGHLY EFFICIENT AND PREDICTABLE SEQUENTIAL TEST DECOMPRESSION LOGIC

(71) Applicant: Cadence Design Systems, Inc., San Jose, CA (US)

(72) Inventors: Steev Wilcox, San Jose, CA (US); Krishna Vijaya Chakravadhanula, Vestal, NY (US); Vivek Chickermane, Slaterville Springs, NY (US); Paul Alexander Cunningham, Mountain View, CA (US); Brian Edward Foutz, Charlottesville, VA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/754,403

(22) Filed: Jun. 29, 2015

(51) Int. Cl.
*G01R 31/3177* (2006.01)
*G01R 31/3181* (2006.01)
*G01R 31/3183* (2006.01)
*G01R 31/3185* (2006.01)
*G01R 31/319* (2006.01)

(52) U.S. Cl.
CPC ... *G01R 31/3177* (2013.01); *G01R 31/31813* (2013.01); *G01R 31/31921* (2013.01); *G01R 31/318335* (2013.01); *G01R 31/318547* (2013.01); *G01R 31/318544* (2013.01)

(58) Field of Classification Search
CPC .... G01R 31/318547; G01R 31/318335; G01R 31/31921; G01R 31/31813; G01R 31/318544

USPC .................................................. 714/738, 729
See application file for complete search history.

(56) References Cited

U.S. PATENT DOCUMENTS

| | | | | |
|---|---|---|---|---|
| 7,610,540 | B2* | 10/2009 | Balakrishnan ... | G01R 31/31921 703/13 |
| 7,647,540 | B2* | 1/2010 | Rajski ............ | G01R 31/318335 703/14 |
| 7,823,034 | B2* | 10/2010 | Wohl ............. | G01R 31/318547 714/726 |
| 7,840,865 | B2* | 11/2010 | Lai ................. | G01R 31/318547 714/728 |
| 7,930,607 | B2* | 4/2011 | Sinanoglu ...... | G01R 31/318335 714/729 |
| 8,479,067 | B2* | 7/2013 | Chandra ........ | G01R 31/318536 714/729 |
| 8,832,512 | B2* | 9/2014 | Czysz ............ | G01R 31/318536 714/738 |
| 8,887,018 | B2 | 11/2014 | Narayanan et al. | |
| 8,914,695 | B2* | 12/2014 | Gizdarski ...... | G01R 31/318547 377/72 |
| 2010/0318863 | A1 | 12/2010 | Whetsel | |
| 2010/0318866 | A1 | 12/2010 | Whetsel | |
| 2012/0096324 | A1 | 4/2012 | Whetsel | |
| 2012/0324305 | A1 | 12/2012 | Whetsel | |
| 2015/0234009 | A1 | 8/2015 | Whetsel | |

(Continued)

*Primary Examiner* — James C Kerveros
(74) *Attorney, Agent, or Firm* — Andrews Kurth Kenyon LLP

(57) ABSTRACT

Systems and methods for a sequential decompressor which builds equations predictably provide a first-in, first out ("FIFO") shift register which is fed by a first XOR decompressor and provides outputs to a second XOR decompressor.

20 Claims, 8 Drawing Sheets

(56) References Cited

U.S. PATENT DOCUMENTS

2015/0276871 A1 10/2015 Ren et al.
2016/0169971 A1 6/2016 Oomman et al.

\* cited by examiner

FIG. 4A

Equations for Channel bits after running for 3 scan clock cycles

|  | | | | |
|---|---|---|---|---|
| Slice 3 | L3 + S21 + S12 + L4 + S11 | L4 + S11 + L3 + S21 + L1 | L3 + S21 + L1 + L2 + L4 + S22 | L3 + S21 + S12 + L2 + L4 + S22 |
| Slice 2 | L4 + S11 + L1 | L1 + L2 + L4 | L2 + L4 + L3 + S21 | L4 + S11 + L3 + S21 |
| Slice 1 | L1 + L2 | L2 + L3 | L3 + L4 | L4 + L1 |

FIG. 4B

PRPG state after 3 clock cycles

|  | | | | |
|---|---|---|---|---|
| After cycle 3 | L2 + L4 + S22 + S13 | L3 + S21 + S12 | S11 + L2 + S22 | L3 + S21 + L1 + S23 |
| After cycle 2 | L3 + S21 + S12 | L4 + S11 | L3 + S21 + L1 | L2 + L4 + S22 |
| After cycle 1 | L4 + S11 | L1 | L2 + L4 | L3 + S21 |
| Initial State | L1 | L2 | L3 | L4 |

FIG. 5A

Equations for Channel bits after running for 5 scan clock cycles

| | | | | |
|---|---|---|---|---|
| Slice 3 | L3+S21+L1+S23+S14+L2+L4+S22+S13 | L2+L4+S22+S13+S12+L1+S23 | S12+L1+S23+S11+L2+S22+S24 | L3+S21+L1+S23+S14+S11+L2+S22+S24 |
| Slice 2 | L2+L4+S22+S13+L3+S21+S12 | L3+S21+S12+S11+L2+S22 | S11+L2+S22+L3+S21+L1+S23 | L2+L4+S22+S13+L3+S21+L1+S23 |
| Slice 1 | L3+S21+S12+L4+S11 | L4+S11+L3+S21+L1 | L3+S21+L1+L2+L4+S22 | L3+S21+S12+L2+L4+S22 |
| Flushed out | L4+S11+L1 | L1+L2+L4 | L2+L4+L3+S21 | L4+S11+L3+S21 |
| Flushed out | L1+L2 | L2+L3 | L3+L4 | L4+L1 |

FIG. 5B

PRPG state after 5 clock cycles

| | | | | | |
|---|---|---|---|---|---|
| After cycle 5 | S11+L2+S22+S24+S15 | L3+S21+L1+S23+S14 | L4+S13+S11+S24 | S12+L1+S23+S25 | S11+L2+S22+S24 |
| After cycle 4 | L3+S21+L1+S23+S14 | L2+L4+S22+S13 | S12+L1+S23 | S11+L2+S22 | L3+S21+L1+S23 |
| After cycle 3 | L2+L4+S22+S13 | L3+S21+S12 | S11+L2+S22 | L3+S21+L1 | L2+L4+S22 |
| After cycle 2 | L3+S21+S12 | L4+S11 | L1 | L3+S21 | L2+L4 |
| After cycle 1 | L4+S11 | L1 |  | L2+L4 | L3+S21 |
| Initial State | L1 | L2 |  | L3 | L4 |

…

METHOD AND SYSTEM FOR CONSTRUCTION OF A HIGHLY EFFICIENT AND PREDICTABLE SEQUENTIAL TEST DECOMPRESSION LOGIC

TECHNICAL FIELD

The present application relates to systems and methods for generating test patterns in testing integrated circuit designs.

CROSS-REFERENCE TO RELATED APPLICATIONS

This application is related to U.S. patent application Ser. No. 14/754,351, entitled "Method and System for Improving Efficiency of XOR-Based Test Compression Using an Embedded Serializer-Deserializer," U.S. patent application Ser. No. 14/754,386, entitled "Method and System for Improving Efficiency of Sequential Test Compression using Overscan," and U.S. patent application Ser. No. 14/737,331, entitled "Elastic Compression—Optimizing Tester Bandwidth with Compressed Test Stimuli Using Overscan and Variable Serialization."

BACKGROUND

Automatic test pattern generation ("ATPG") was developed to explicitly test each gate and path in an integrated circuit ("IC") design. As ICs have become larger and more complex, the amount of logic to be tested per input/output test pin has increased dramatically.

When an ATPG tool generates a scan test for a fault, or a set of faults, only a small percentage of scan cells in the scan channels need to take specific values (e.g., care bits). The rest of the cells in the scan channel are "don't care", and are usually filled with random values. Relatively few bits in an ATPG generated test pattern are "care" bits.

Test Compression takes advantage of the small number of significant values (care bits) to reduce test data and test time. However, as Test Compression decreases channel lengths, the number of specified bits (e.g., care bits) per time slice increases. An ATPG process for a certain test pattern may specify certain bits (e.g., care bits) across multiple time slices of the test pattern in order to reduce toggling, and, therefore, power consumption. There can be a large variance in the number of care bits across time slices.

XOR decompressors cannot solve for slices that have more care bits than the available scan data (e.g., input variables). Further, XOR decompressors are also limited in that they are restricted to using only the scan data available in the same scan cycle. This leads to inefficiencies. For example, if the ATPG generated test only requires few care bits in a scan slice, then the rest of the scan data will remain unused.

Sequential decompressors overcome the above-discussed inefficiencies of the XOR decompressors by solving the linear equations of the entire test pattern simultaneously instead of slice-by-slice. Scan data is reused among multiple scan slices, so that scan data from scan slices having fewer care bits can be utilized in solving for scan slices with more care bits. The most common sequential decompressor network contains a linear feedback shift register ("LFSR") (also referred to as a Pseudo-Random Pattern Generator—PRPG) that receives data from a plurality of scan input signals and that sends its outputs through a linear spreader network of a plurality of XOR logic gates (e.g., a XOR decompressor).

The outputs of the XOR decompressor are fed to scan channels. The outputs fed to the scan channels are a linear combination of the values from the PRPG starting state and the data inputted from a tester into the circuit through scan-input pins. The values outputted from the XOR decompressor lead to linear equations to determine the values to be sent into each scan channels. The randomness caused by the PRPG makes it more difficult to predict the rate of correlation (e.g., how interdependent a variable of one equation is to a variable of another equation) and, therefore, which correlated variables will cancel out in the generated system of equations. Accordingly, predicting whether unique equations can be generated for even scan bit also becomes more difficult. An ATPG process would need to iterate through many different design configurations to determine which set of unique equations is best.

Accordingly, there is a need for an efficient method of bringing in additional variables into the PRPG in the early cycles of the ATPG process without utilizing any additional hardware or control pins.

Further, there is also a need for a sequential decompressor which builds equations in a more predictable manner than a normal PRPG so that there is no correlation between equations feeding adjacent scan channels that need to be independently set to specific care-bit values.

BRIEF DESCRIPTION OF THE DRAWINGS

FIG. 4A illustrates the linear equations for the scan channel bits after the sequential decompressor of FIG. 3 runs for the length of the longest channel.

FIG. 4B illustrates the state of each bit in the PRPG of FIG. 3 after running the PRPG for the length of the longest channel.

FIG. 5A illustrates the linear equations for the scan channel bits after the sequential decompressor of FIG. 3 runs for longer than the length of the longest scan channel.

FIG. 5B illustrates the state of each bit in the PRPG of FIG. 3 after running for longer than the length of the longest scan channel.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of skill in the art reviewing the description of embodiments should be able to learn and understand the different described aspects of the invention.

The description of embodiments should facilitate understanding of the invention to such an extent that other implementations of the invention, not specifically covered but within the knowledge of a person of skill in the art having read the description of embodiments, would be understood to be consistent with an application of the invention.

One aspect of the present disclosure is to provide systems and methods for a sequential decompressor which builds equations in a more predictable manner than the PRPG linear feedback shift register. The methods and apparatuses herein address at least one of the ATPG problems described above. Accordingly, a first-in, first out ("FIFO") shift register with a XOR decompressor network is provided.

According to an embodiment, a computer-implemented method for generating test patterns includes: receiving, at a first spreading network of XOR logic gates, a plurality of scan inputs from a tester; feeding, with outputs of the first spreading network, a linear shift register; updating, using the outputs of the first spreading network, bits in the linear shift register, each bit of the linear shift register being shifted at each shift cycle for a plurality of shift cycles; feeding a set of outputs from the linear shift register to a second spreading network of XOR logic gates; and feeding a set of outputs from the second spreading network to a set of scan channels.

Figure 1:
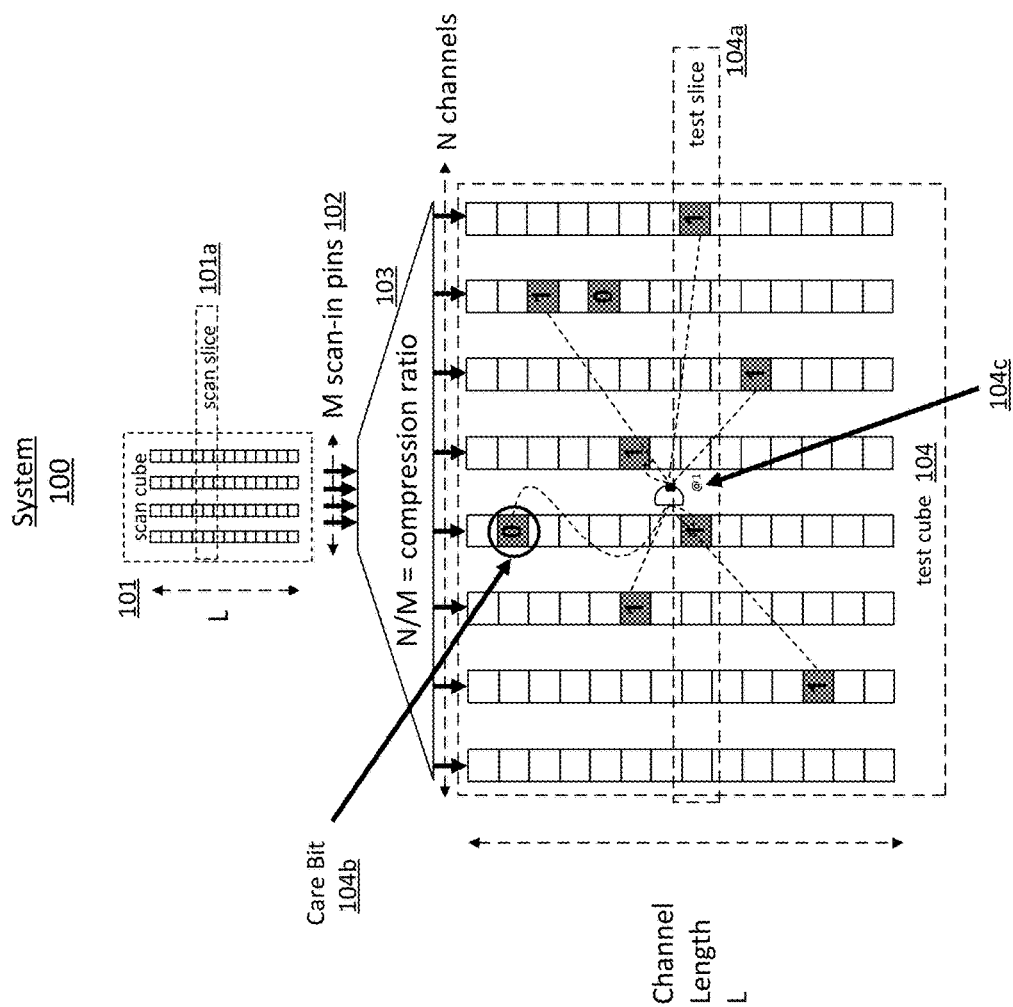
FIG. 1 illustrates elements of a system utilized during automatic test pattern generation.

FIG. 1 illustrates elements 100 of a system utilized during automatic test pattern generation, utilizing scan cube 101 (which includes one of many scan slices 101a), includes scan-in pins 102, decompressor 103, producing test cube 104 (which includes one of many test slices 104a, as well as care bits 104b, and an indication 104c of a faulty AND gate). In an embodiment, scan cube 101 is the generated test pattern that will be applied to a potential digital circuit in order to distinguish between proper circuit behavior and faulty circuit behavior caused by defects. Accordingly, in an embodiment, scan slice 101a will be applied to flip-flops associated with the location of scan slice 101a during the test of the digital circuit. In an embodiment, during the automatic test pattern generation process, care bits 104b are placed throughout the various test slices 104a of the scan channels of test cube 104 in rder to test for faults. For example, in order to properly detect fault 104c care bit 104b (as well as othercare bits indicated by a binary value of either 1 or 0) are required to be placed in specified locations in the scan channels as illustrated in FIG. 1. In an embodiment, the fault to be tested for in the digital circuit is an AND gate which is stuck-at 1 (e.g., an individual pin is stuck at a logical '1') Further, as depicted in FIG. 1, the compression ratio of decompressor 103 refers to the ratio of the number of the channels N to the number of the scan-in pins M.

In an embodiment, each scan cycle with care bits is solved one at a time from the earliest scan cycle with care bits (e.g., closer to the bottom of the test cube 104) to the last scan cycle with care bits (e.g., closer to the bottom of the decompressor 103), so that the ATPG process focuses on solving just the scan cycle of interest. Specifically, the equation solver solves for the variables (e.g., scan-in pin 102 inputs) necessary to generate the desired care bits (e.g., 104b) at each scan slice of the scan channels. Each channel input of the scan slice generally corresponds to a different Boolean combination (e.g., due to the decompressor 103) of the input bit variables (e.g., scan-in pin 102 inputs). Accordingly, each scan slice corresponds to a plurality of linear equations (e.g., ax=b). With the Boolean combinations provided by the decompressor 103 (e.g., the "a") and the corresponding care bit values (e.g., the "b") for each of the scan channels of the scan cycle, the equation solver can solve for the desired scan input variables (e.g., the "x"). After the equation solver determines the desired scan input variables, the variables are extracted to a corresponding location in the scan pattern.

Figure 2:
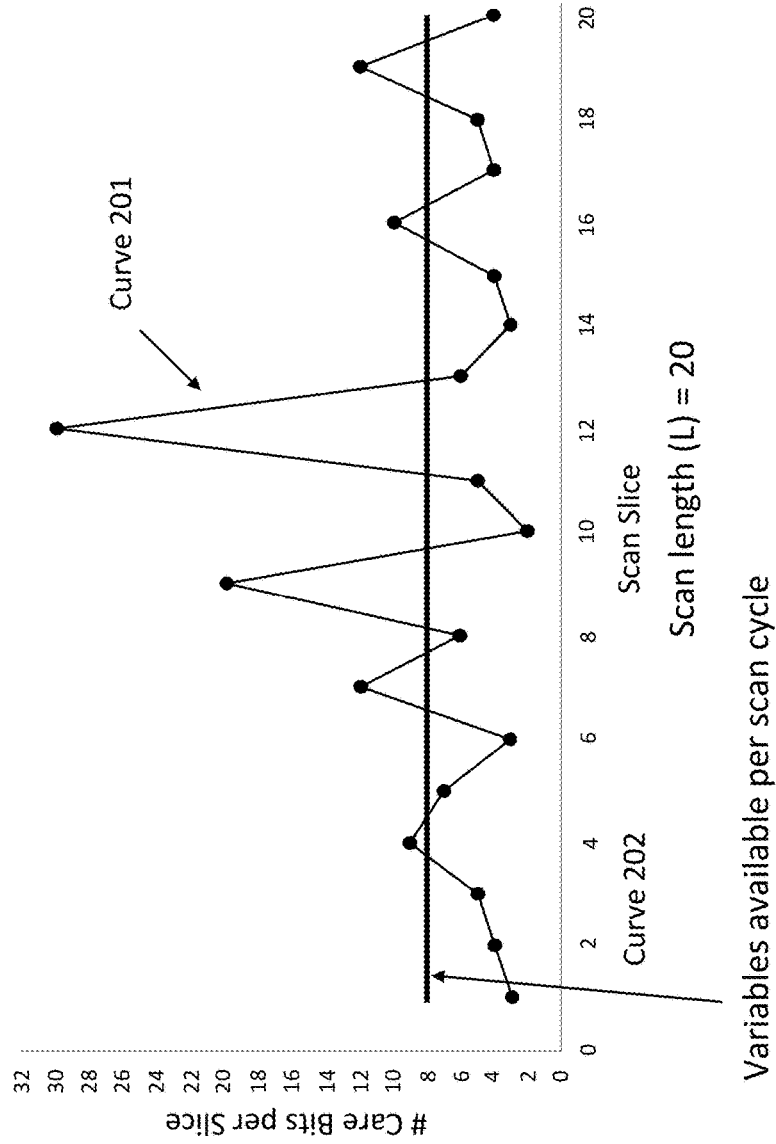
FIG. 2 is a graph depicting the total number of care bits that can be solved for, per scan slice, with a standard XOR decompressor.

FIG. 2 is a graph depicting the total number of care bits that can be solved for, per scan slice, with a standard XOR decompressor. For example, assuming 8 scan-in inputs, the XOR decompressor would shift in 8 variables every scan cycle (see curve 202). Accordingly, the equation solver can solve a maximum of 8 care bits per scan slice (e.g., 3 care bits or less is usually guaranteed). Thus, as depicted in FIG. 2, many scan slices with care bits exceeding 8 will not be solved (see curve 201). Specifically, with the XOR decompressor, many of the 154 care bits in the test pattern will not be solved. Further, as depicted in FIG. 2, the data volume (e.g., the product of the number of scan-in inputs M and the scan length L) of the XOR decompressor is 160 bits (e.g., area under curve 202).

Figure 3:
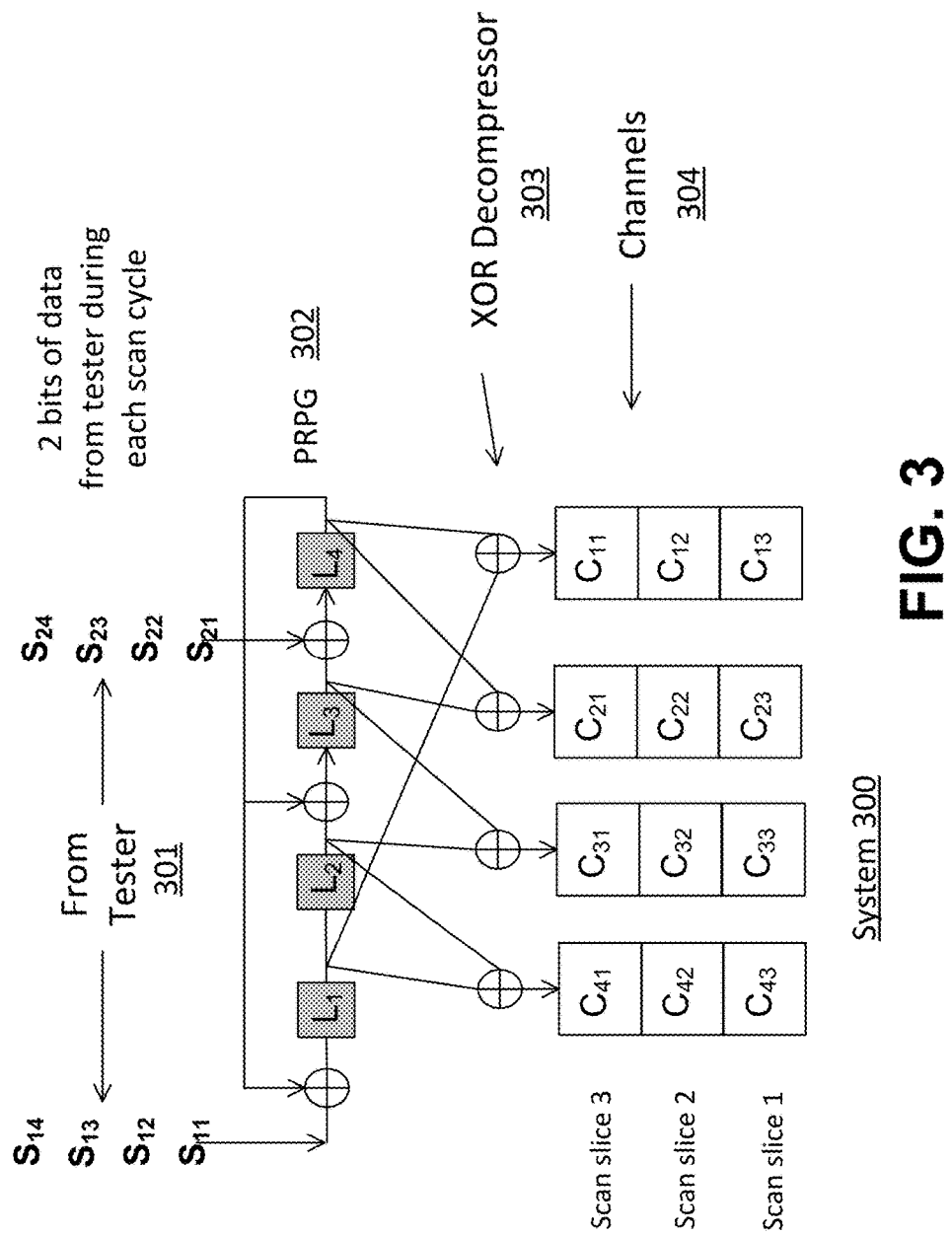
FIG. 3 illustrates elements of a sequential decompressor system using a PRPG.

FIG. 3 illustrates elements of a sequential decompressor system using a PRPG. System 300 includes input signals 301 from the tester, a LFSR 302 (also referred to as a PRPG), XOR decompressor 303 and scan channels 304. In an embodiment, two bits of data come in from the tester as input signals 301 for each scan cycle. For example, at the first scan cycle, $S_{11}$ and $S_{21}$ come in as input signals 301. In the next scan cycle, $S_{12}$ and $S_{22}$ come in as input signals 301, etc. Input signals 301 are input into PRPG 302 and shifted into shift registers of PRPG 302 for each scan cycle. Further, input signals 301 are XORed with the shifted values of PRPG 302 (including initial state values of the shift registers $L_1$, $L_2$, $L_3$ and $L_4$) for each scan cycle. In an embodiment, the outputs of the shift registers $L_1$, $L_2$, $L_3$ and $L_4$ are fed to an XOR decompressor 303. The output of XOR decompressor 303 is input to scan channels 304 at each scan cycle.

FIG. 4A illustrates the linear equations for the scan channel bits after the sequential decompressor of FIG. 3 runs for the length of the longest channel. In other words, FIG. 4A illustrates the linear equations for the scan channel bits after the sequential decompressor of FIG. 3 runs for three clock cycles. As depicted in FIG. 4A, the initial scan slices (e.g., scan slice 1 and scan slice 2) have equations comprising of only the initial state values (e.g., $L_1$, $L_2$, $L_3$, and $L_4$) of the shift registers of the PRPG. Therefore, as there are no input variables (e.g., $S_{11}$ and $S_{21}$), any care bits in these bit positions will most likely not be solved.

FIG. 4B illustrates the state of each bit in the PRPG of FIG. 3 after running the PRPG for the length of the longest channel. Similar to FIG. 4A, the PRPG in FIG. 4B is run for three clock cycles. As depicted in FIG. 4B, after cycle 1, only shift registers $L_1$ and $L_4$ have equations including input variables. However, shift registers $L_1$ and $L_4$ only have equations including the initial state values of the PRPG 302. In fact, it takes three clock cycles for each of the shift registers (e.g., $L_1$, $L_2$, $L_3$, and $L_4$) to include input variables in their respective equations. Therefore, more than three clock cycles (e.g., the length of the longest channel) is required to prime PRPG 302 (e.g., update with values from input signals 301).

FIG. 5A illustrates the linear equations for the scan channel bits after the sequential decompressor of FIG. 3 runs for longer than the length of the longest scan channel. Specifically, FIG. 5A illustrates the linear equations for the scan channel bits after the sequential decompressor of FIG. 3 runs for five clock cycles. Therefore, the sequential decompressor of FIG. 3 overscans for an additional two cycles as compared with FIG. 4A. As depicted in FIG. 5A, after five clock cycles, the linear equations for the scan channel bits for the last three slices (e.g., the top three slices) all include input variables. Therefore, care bits corresponding to the bit positions in the top three slices will most likely be solved. In an embodiment, the shift registers of PRPG 302 and the scan channels 304 are clocked at the same timing signal. In other words, data is shifted down into the scan channels 304 while the PRPG 302 is being primed with the input variables. Accordingly, there is no need to freeze the clocks of the scan channels 304 while the PRPG 302 is being primed. Therefore, there is no need for additional hardware and/or control pins in order to prime the PRPG 302.

In an embodiment, as depicted in FIG. 5A, the earlier cycles (e.g., corresponding to channel bit equations with no input variables) are flushed out (e.g., removed). Specifically, as depicted in FIG. 5A, the earliest two cycles (e.g., the bottom two slices) are flushed out. Accordingly, the final channel content will include only the top three slices. In an embodiment, the earliest scan cycles are flushed out at the end of the scan process (e.g., after the equations for each channel bit of the scan channels all include input variables). In an embodiment, the lengths of each scan channel of the scan channels 304 could be different. Accordingly, in an embodiment, knowing the lengths of each scan channel of the scan channels 304 makes is possible to determine which scan slices of which channel to flush out at the end of the scan process. In an embodiment, the scan process can be overscanned by at least one clock cycle greater than the length of the longest scan channel. In another embodiment, the scan process can be overscanned at a clock cycle that is less than the number of PRPG bits divided by the number of scan-in inputs, meaning that the scan process is overscanned enough to prime the PRPG bits. Accordingly, the scan process of FIG. 4A only needs to be overscanned by two clock cycles (e.g., 4 PRPG bits divided by 2 scan-in inputs).

FIG. 5B illustrates the state of each bit in the PRPG of FIG. 3 after running for longer than the length of the longest scan channel. Similarly to FIG. 5A, the PRPG in FIG. 5B is run for five clock cycles. Further, as depicted in FIG. 5B, after clock cycle three, all of the shift registers of PRPG 302 are primed with input variables.

Figure 6:
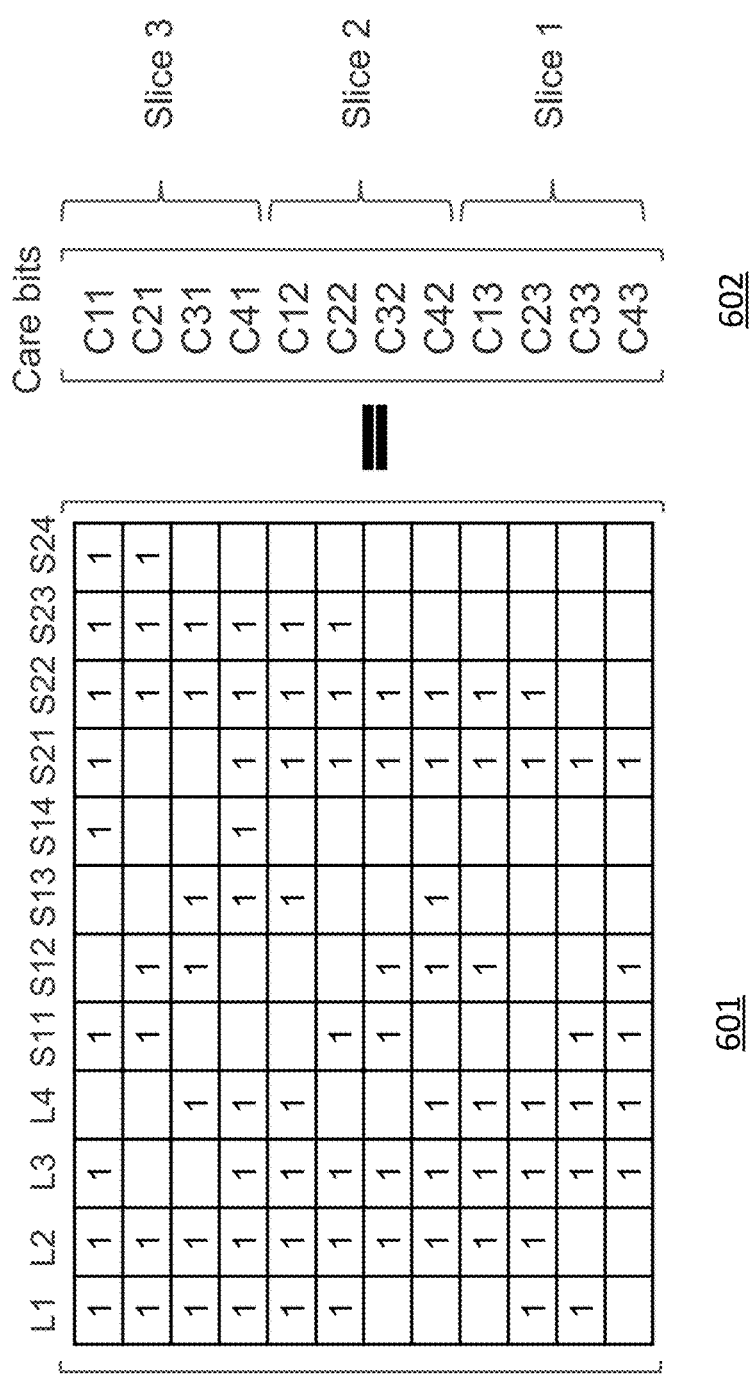
FIG. 6 depicts the system of linear equations for the sequential decompressor of FIG. 3.

FIG. 6 depicts the system of linear equations for the sequential decompressor of FIG. 3 after running the scan process for five clock cycles (e.g., overscanned). Matrix 601 depicts the linear equation for each of the channel bits in the test pattern. For example, the first row of matrix 601 corresponds to the linear equation for channel bit C11. Similarly, the second row of matrix 601 corresponds to the linear equation for channel bit C21, etc. Vertex 602 can be populated based on the care bits of the corresponding scan slices of the test pattern. In an embodiment, L1 to L4 can be removed from matrix 601 as they will most likely be zero. Accordingly, with matrix 601 (e.g., the "a" in ax=b) and vertex 602 (e.g., the "b" in ax=b) input variables $S_{11}$, $S_{12}$, $S_{13}$, $S_{14}$, $S_{21}$, $S_{22}$, $S_{23}$ and $S_{24}$ (e.g., the "x" in ax=b) can be determined for the entire test pattern.

Figure 7:
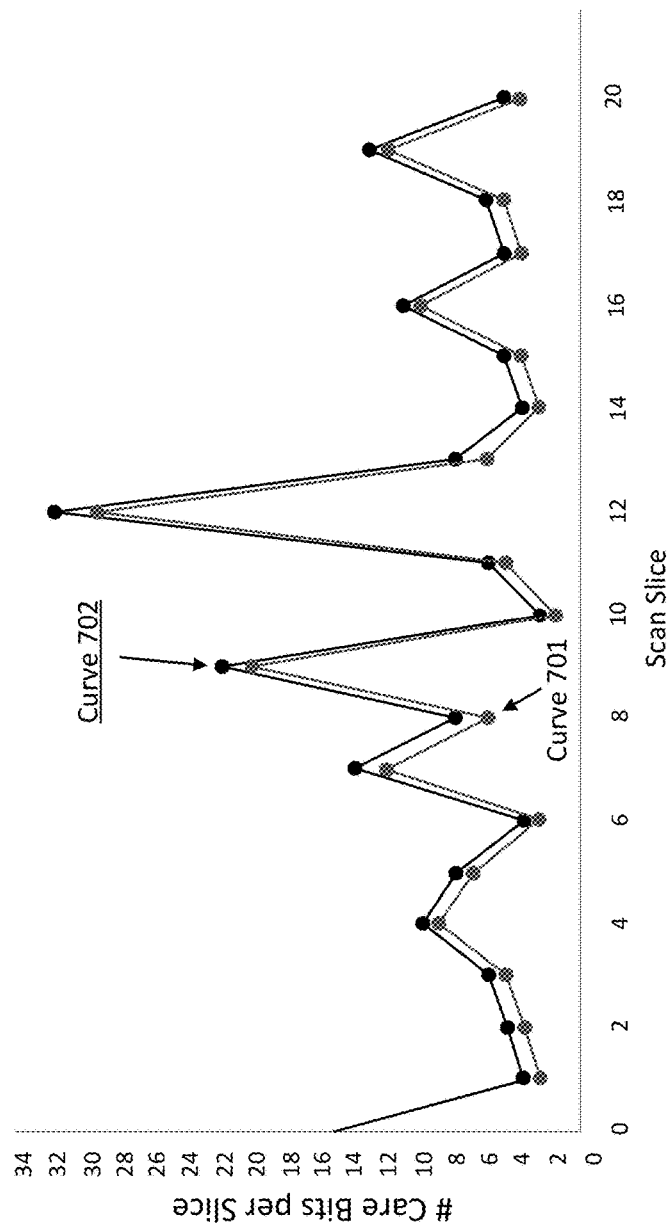
FIG. 7 illustrates a graph depicting the total number of care bits that can be solved for in a test a pattern with the sequential decompressor utilizing overscan.

FIG. 7 is a graph depicting the total number of care bits that can be solved for in a test pattern with the sequential decompressor utilizing overscan. For example, assuming 8 scan-in inputs, the PRPG shifts in 8 variables every scan cycle. Further, as depicted by FIG. 7, the equation solver utilizes unused variables from sparse slices (e.g., lower number of care bits) to solve for the linear equation at dense slices (e.g., higher number of care bits) (see curve 702). Accordingly, the equation solver is able to solve for all of the 154 care bits in the test pattern. Further, as depicted by FIG. 7, the PRPG requires some number of overscan cycles to prime it with enough variables (see curve 702 between scan slice 0 and scan slice 1). Further, as depicted in FIG. 7, the data volume (e.g., the sum of the (i) overscan and (ii) the product of the number of scan-in inputs M and the scan length L) of the PRPG is 176 bits (e.g., area under curve 702). Accordingly, the equation can solve for any test cube distribution as long as it is under curve 702.

Figure 8:
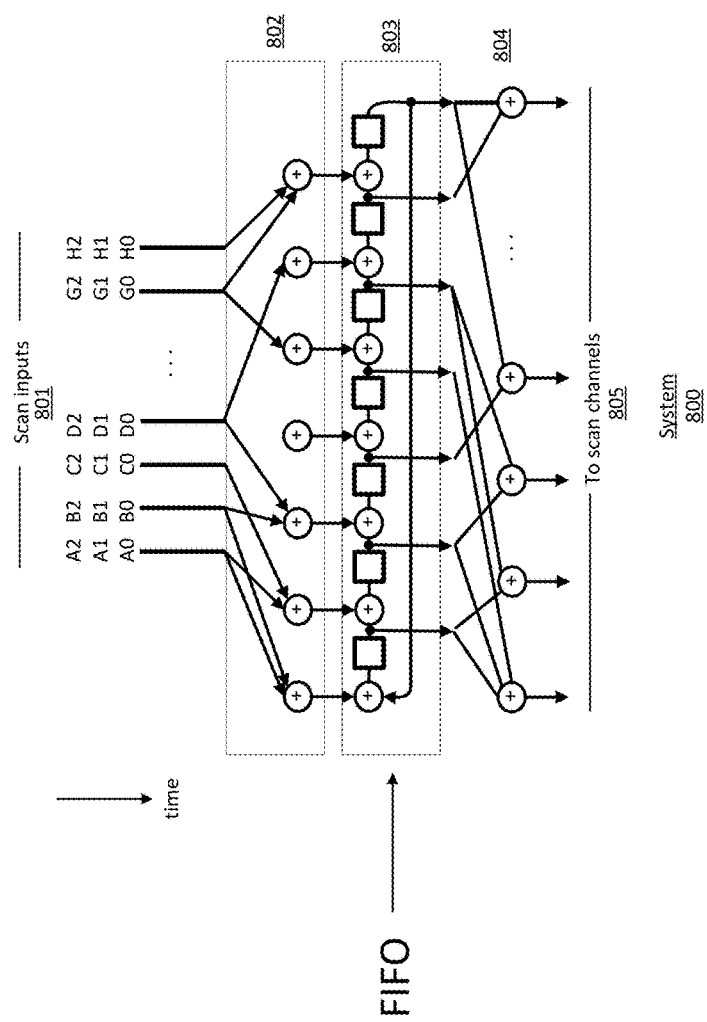
FIG. 8 illustrates elements of a multi-stage decompressor network system including a first-in, first-out linear shift register.

FIG. 8 illustrates elements of a multi-stage decompressor network system 800 including a first-in, first-out linear shift register. System 800 includes a first XOR decompressor 802 (e.g., a spreading network of XOR logic gates) receiving input signals 801 from a tester. The system 800 further includes a FIFO linear shift register 803, a second XOR decompressor 804 (e.g., a second spreading network of XOR logic gates) and scan channels 805. In an embodiment, bits of data come in from the tester as input signals 801 for each scan cycle. For example, at the first scan cycle, A0, B0, C0, D0 . . . G0, and H0 come in as input signals 801. In the next scan cycle, A1, B1, C1, D1 . . . G1, and H1 come in as input signals 801, etc. In an embodiment, input signals 801 are first fed into first XOR decompressor 802. In an embodiment, in order to generate unique equations with less correlation between channels, an odd number of inputs are XORed together with the first XOR decompressor 802. For example, for k inputs, first XOR decompressor 802 generates $2^{k-1}$ expressions, which in turn are fed into each of the bit registers of the FIFO linear shift register 803. Accordingly, on any clock cycle i, each bit of the FIFO linear shift register 803 contains an odd number of bits from the ith set of scan inputs. Further, in an embodiment, because the FIFO linear shift register 803 is a shift register, the above-mentioned property persists over time. Therefore, each bit contains an odd number of bits from every previous set of scan inputs. In an embodiment, outputs from the FIFO linear shift register 803 are fed into second XOR decompressor 804. In an embodiment, only an odd number of outputs from the FIFO linear shift register 803 are XORed together with the second XOR decompressor 804. The outputs of the second XOR decompressor 804 are then fed into the scan channels 805. In an embodiment, because the second XOR decompressor 804 only XORs together an odd number of outputs from the FIFO linear shift register 803, the only bits in the scan chain that can be the same are bits in the same scan slice. Accordingly, with embodiments of the system 800, equations can be generated such that no two bits in the same scan slice are the same. In an embodiment, the second XOR decompressor 804 can generate $2^{2^{k-1}}$ expressions. However, not that many expressions may be needed. Accordingly, in an embodiment, any-number-of-odd-terms can be picked (e.g., with a decoder) to be XORed by the second XOR decompressor 804. In another embodiment, only $2^{2(k-1)}$ expressions are needed to utilize the aforementioned properties of the system 800. In an embodiment, a heuristic may be used to determine the correct $2^{2(k-1)}$ expressions. Specifically, assuming the number of inputs (e.g., k=8), the heuristic may include: (i) for every number from 0 to 255 (in binary), multiply each by 53 (mod 256) and (ii) if the result has an odd number of ones, use the result as the XOR expression to be input next into the flops of FIFO linear shift register 803. Accordingly, the system 800 provides the ability to achieve unique and predictable equations for every scan bit in the design.

In another embodiment, either the first XOR decompressor 802 or the second XOR decompressor 804 can include a hierarchical XOR gate structure.

In another embodiment, the aforementioned overscan method can also be utilized by system 800 in order to prime the shift registers of the FIFO linear shift register 803. In another embodiment, input signals 801 are fed directly into (i) the FIFO linear shift register 803 and (ii) the scan channels 805. Accordingly, the first cycle of scan data to impact the scan channels 805 immediately. As such, the first cycle of scan data does not need to be removed from the scan channels as was the case with PRPG utilizing the overscan method.

Some of the foregoing embodiments refer to algorithms, sequences, macros, and operations that require execution of instructions and the usage of a memory. Execution of the instructions stored in memory may be performed by a processing device of an apparatus, the processing device specific to the apparatus. The apparatus hosting the processing device may be in some circumstances the ATE, or in other circumstances, the IC. The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, read-only memories (ROMs), random access memories (RAMs), electrically erasable programmable read-only memory (EEPROM), flash memory, magnetic or optical cards, or an type of media that stores electronic instructions. Each of the memory devices implemented in the apparatus is further connected to or coupled to a system bus or a network connection, wired or unwired, capable of facilitating or driving communications.

In the foregoing Description of Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A computer-implemented method for generating test patterns, the method comprising:
   receiving, at a first spreading network of XOR logic gates, a plurality of scan inputs from a tester;
   feeding, with outputs of the first spreading network, a linear shift register;
   updating, using the outputs of the first spreading network, bits in the linear shift register, each bit of the linear shift register being shifted at each shift cycle for a plurality of shift cycles, wherein one of the outputs of the first spreading network is shifted between a plurality of shift registers of the linear shift register;
   feeding a set of outputs from the linear shift register to a second spreading network of XOR logic gates; and
   feeding a set of outputs from the second spreading network to a set of scan channels.

2. The computer-implemented method of claim 1, wherein the number of the plurality of shift cycles is greater than a number of scan channel bits of a longest scan channel, of the set of scan channels, by at least one.

3. The computer-implemented method of claim 2, wherein the set of scan channels and each shift register of the linear shift register are clocked at a same timing signal for the plurality of shift cycles.

4. The computer-implemented method of claim 3, wherein, after each bit of the linear shift register is shifted for a number of shift cycles corresponding to the number of scan channel bits of the longest scan channel, each bit is shifted for an additional number of shift cycles, wherein the additional number is less than a value equivalent to: a total number of shift registers divided by a total number of scan input signals.

5. The computer-implemented method of claim 1, wherein the set of outputs from the first spreading network is created using an odd number of the scan inputs.

6. The computer-implemented method of claim 1, wherein the set of outputs from the second spreading network is created using an odd number of outputs from the linear shift register.

7. The computer-implemented method of claim 1, wherein the plurality of scan inputs from the tester is also fed directly into (i) the linear shift register and (ii) the set of scan channels.

8. An automatic test pattern generation system, comprising:
   a first spreading network of XOR logic gates, configured to receive m scan inputs from a tester;
   a $2^{m-1}$ bit linear shift register which updates bits in the linear shift register using a set of $2^{m-1}$ outputs from the first spreading network, wherein each bit of the linear shift register is shifted at each shift cycle for a plurality of shift cycles, wherein one of the outputs of the first spreading network is shifted between a plurality of shift registers of the linear shift register; and
   a second spreading network of XOR logic gates, configured to receive a set of outputs from the linear shift register, wherein a set of outputs from the spreading network is output to a set of scan channels.

9. The automatic test pattern generation system of claim 8, wherein the number of the plurality of shift cycles is greater than a number of scan channel bits of a longest scan channel, of the set of scan channels, by at least one.

10. The automatic test pattern generation system of claim 9, wherein the set of scan channels and each shift register of the linear shift register are clocked at a same timing signal for the plurality of shift cycles.

11. The automatic test pattern generation system of claim 8, wherein the set of outputs from the first spreading network is created using an odd number of the scan inputs.

12. The automatic test pattern generation system of claim 8, wherein the set of outputs from the second spreading network is created using an odd number of outputs from the linear shift register.

13. The automatic test pattern generation system of claim 8, wherein the plurality of scan inputs from the tester is also fed directly into (i) the linear shift register and (ii) the set of scan channels.

14. The automatic test pattern generation system of claim 8, wherein at least one of the first spreading network and the second spreading network is hierarchical.

15. A non-transitory computer readable medium containing program instructions for generating test patterns, wherein execution of the program instructions by one or more processors of a computer system causes one or more processors to do the following:

receiving, at a first spreading network of XOR logic gates, a plurality of scan inputs from a tester;

feeding, with outputs of the first spreading network, a linear shift register;

updating, using the outputs of the first spreading network, bits in the linear shift register, each bit of the linear shift register being shifted at each shift cycle for a plurality of shift cycles, wherein one of the outputs of the first spreading network is shifted between a plurality of shift registers of the linear shift register;

feeding a set of outputs from the linear shift register to a second spreading network of XOR logic gates; and feeding a set of outputs from the second spreading network to a set of scan channels.

16. The non-transitory computer readable medium of claim 15, wherein the number of the plurality of shift cycles is greater than a number of scan channel bits of a longest scan channel, of the set of scan channels, by at least one.

17. The non-transitory computer readable medium of claim 16, wherein the set of scan channels and each shift register of the linear shift register are clocked at a same timing signal for the plurality of shift cycles.

18. The non-transitory computer readable medium of claim 17, wherein the plurality of scan inputs from the tester is also fed directly into (i) the linear shift register and (ii) the set of scan channels.

19. The non-transitory computer readable medium of claim 16, wherein the set of outputs from the second spreading network is created using an odd number of outputs from the linear shift register.

20. The non-transitory computer readable medium of claim 15, wherein the set of outputs from the first spreading network is created using an odd number of the scan inputs.

* * * * *